United States Patent [11] 3,574,933

[72] Inventors Art E. Cassingham
Los Altos;
Arvin C. Skyrud, Milpitas, Calif.
[21] Appl. No. 779,845
[22] Filed Nov. 29, 1968
[45] Patented Apr. 13, 1971
[73] Assignee Sylvania Electric Products Inc.

[54] METHOD OF MAKING PRINTED CIRCUIT BOARDS WITH PLATED-THROUGH HOLES

6 Claims, 11 Drawing Figs.

[52] U.S. Cl. .......... 29/625, 29/631, 96/36.2
[51] Int. Cl. .......... B41m 3/08, H05k 3/00, G03c 5/00
[50] Field of Search .......... 29/625, 631; 96/36.2

[56] References Cited
UNITED STATES PATENTS

| | | | |
|---|---|---|---|
| 3,240,602 | 3/1966 | Johnston | 96/36.2 |
| 3,297,442 | 1/1967 | Spiers | 96/36.2 |
| 3,365,292 | 1/1968 | Fiore | 96/36.2X |
| 3,384,957 | 5/1968 | Shannon | 29/626 |
| 3,385,702 | 5/1968 | Koehler | 96/36.2 |
| 3,423,205 | 1/1969 | Skaggs | 96/36.2 |
| 3,423,260 | 1/1969 | Heath | 156/3 |
| 3,501,831 | 3/1970 | Gordon | 29/625 |
| 3,506,482 | 4/1970 | Hirohata | 29/625X |

FOREIGN PATENTS

| | | | |
|---|---|---|---|
| 776,343 | 6/1957 | Great Britain | 29/625 |

OTHER REFERENCES

" Kodak" publication: " Photofabrication of Printed Circuits," 7/67 Revision, portion entitled " Plated Through Holes," only the date and title pages, and pages 22 and 25 are relied on (29/625) (copy attached)

*Primary Examiner*—Wayne A. Morse, Jr.
*Attorneys*—Norman J. O'Malley, Elmer J. Nealon and John F. Lawler

ABSTRACT: Artwork for printed circuit boards with plated-through holes is made with terminal area pads having center openings covered with an optical filter, preferably a colored strip. By appropriately filtering light passing through the artwork, two master transparencies are made photographically, one with and the other without center hole images corresponding to the center openings in the pads. The transparency with such images is used to expose a photosensitized copper-clad board for locating centers of the holes preparatory to drilling of the board. The transparency without center hole images is used to transfer the same circuit pattern to the drilled board after the holes have been metallized and the board is again photosensitized. The board is plated with etch-resistant metal, stripped and finally is etched to complete the circuit pattern on one or both sides of the board.

*INVENTORS*
ART E. CASSINGHAM
ARVIN C. SKYRUD

BY [signature]
ATTORNEY

INVENTORS
ART E. CASSINGHAM
ARVIN C. SKYRUD

BY John F. Lawler
ATTORNEY

METHOD OF MAKING PRINTED CIRCUIT BOARDS WITH PLATED-THROUGH HOLES

BACKGROUND OF THE INVENTION

This invention relates to printed circuit boards, and more particularly to an improved method of making printed circuit boards with plated-through holes.

During the process of making printed circuit boards with plated-through holes, the plastic board or laminate is drilled and thereafter is metallized to conductively coat the sides of the holes. The desired circuit patterns are then formed on opposite sides of the board in proper registry with the holes. In order to first locate the centers of the holes to be drilled, the circuit pattern is photographically transferred to the board using a transparency on which are formed images of the center openings in artwork pads. After the holes are drilled and metallized, the process is repeated to permanently form the circuit patterns on the board in precise alignment with the holes.

The technique regularly used to insure precise alignment of the final patterns and the holes in the board is to expose the board through the same or duplicate transparency for both the hole drilling and final pattern forming steps. However, this technique requires that images of the pad holes on the transparency be removed or covered prior to exposure of the sensitized board in order to prevent light penetration into the holes and thus to insure that the sides of the holes in the finished board will be completely covered with conductive plating.

The practice in the past has been to cover the pad hole images on a positive transparency by manually dubbing each such image with an opaquing compound. Alternatively the hole images on the negative transparency may be manually removed by scraping. These operations are not only tedious, slow and costly but also tend to produce lower quality circuit boards as a result of human error in dubbing or scraping and as a result of cracking, chipping or flaking of the opaquing compound during subsequent photographic exposure. The amount of operator time required for such dubbing is directly proportional to the number, density and size of the pad center-opening images to be covered; by way of example, the opaquing of one transparency having 250 hole images, each 0.02 inch in diameter in an area of 4 inches × 6 inches requires approximately 30 minutes of operator time, or 1 hour for a two-sided board.

An object of this invention is the provision of a method of making circuit boards with plated-through holes wherein the step of manually opaquing the master transparency is completely eliminated.

A further object is the provision of a simple time-saving technique for making two master transparencies from the same art sheet, one having images corresponding to the centers of holes to be drilled in the board, the other being formed without those images.

SUMMARY OF THE INVENTION

An artwork termination pad with a center opening covered by an optical filter is used in the artwork layout from which two reduced master transparencies of the circuit pattern are made photographically in a matter of a few seconds. One of the transparencies has the image of the center openings of the pads and is used to photographically transfer the circuit pattern with pad center openings to the imperforate board for locating centers of holes to be drilled in the board. The other transparency is used to photographically transfer the circuit pattern without pad center openings to the drilled and metallized board for forming the final circuit pattern on it. By using a pad with a center hole filter, it is possible to make the master transparency without pad center openings photographically in a matter of a few seconds and thus eliminate the manual opaquing step from the process of making printed circuit boards.

DESCRIPTION OF PREFERRED EMBODIMENT

In order to better understand the invention it is well to briefly review the prior art procedure followed in the making of printed circuit boards with plated-through holes by the widely used electroplating and etching process.

Figure 1:
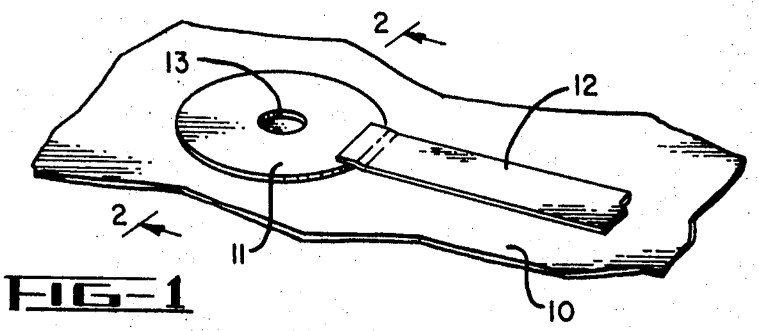
FIG. 1 is a perspective view of a prior art tape and termination pad used in the layout of the artwork for printed circuit boards with plated-through holes.
Figure 2:
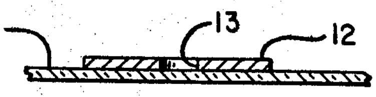
FIG-2 PRIOR ART
FIG. 2 is a section taken on line 2–2 of FIG. 1.

One of the initial steps in the process of making printed circuit boards with plated-through holes is the construction of the artwork. This includes layout of the circuit pattern on a preferably transparent art sheet 10, see FIGS. 1 and 2, with pressure sensitive tape for conductor lines and pads corresponding to the conductor termination areas. While a single artwork sheet typically may have over 100 pads and separate lengths of tape, only one such pad 11 and tape 12 are shown in the drawings for the sake of simplicity and clarity of the description. The scale of the circuit pattern made on the art sheet 10 in this manner is generally enlarged compared to the size of the circuit pattern to be ultimately deposited on the circuit board, the artwork pattern being reproduced photographically to the desired size as is well known in the art. In the preparation of art sheets for printed circuit boards with plated-through holes, pads 11 having center openings 13 are used to locate the position of the holes in the board with respect to the circuits formed on them.

After the desired circuit pattern has been laid out on the art sheet, a master photographic transparency, either a negative or a positive or both, is made by photographically transferring the pattern on the art sheet. The surface of a copper-clad plastic board or laminate is photosensitized with a photoresist and then is photographically exposed through this master transparency. A temporary circuit pattern is formed on the board by the developed photoresist, the centers of the holes to be drilled being located by the developed images of the center hole 13 of each pad. After the holes are drilled in the board, the latter is plated with a thin layer of copper in order to metallize the sides of the holes and to provide a base for later plating of the holes.

The board is next photosensitized with a photoresist coating and is again exposed through the same or duplicate transparency in proper registry with the drilled holes. The photoresist invariably coats at least part of the copper plate on the sides of the holes and as a consequence steps must be taken to remove or block the hole center images on the transparency to insure optical isolation of the drilled holes from deleterious effects of light. Thus, if the transparency is a positive and the photoresist is a resist to plating rather than a resist to etching, light penetration of the drilled hole causes the photoresist to polymerize and harden and, if allowed to remain, to ultimately cause voids or like discontinuities in the final plating on the sides of the holes. It is extremely difficult if not impossible to remove hardened photoresist from the drilled holes, short of redrilling them. Therefore, in order to prevent such light penetration, the pad hole images on the reduced positive transparency, according to conventional practice, are manually dubbed with an opaquing substance so that the image of each pad is completely opaque. The board is then exposed through the dubbed master, the desired circuit pattern is plated with an etch-resistant metal, and the resist is stripped to complete one side of the board. A desired circuit pattern may be similarly formed on the opposite side in alignment with the drilled holes to make a double-sided board.

Figure 5:
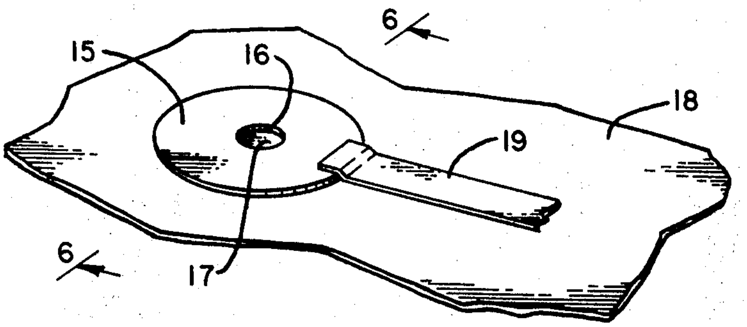
FIG. 5 is a view similar to FIG. 1 with the pad of FIGS. 3 and 4.
Figure 6:
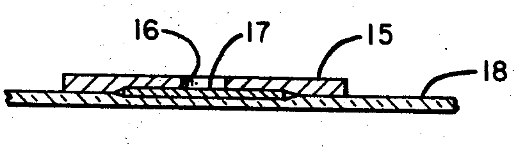
FIG. 6 is a section taken on line 6–6 of FIG. 5.
Figure 3:
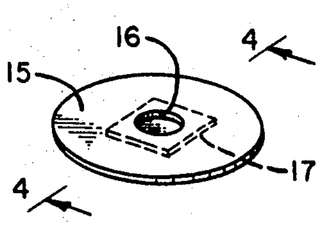
FIG. 3 is a perspective view of a termination pad used in the practice of this invention.
Figure 4:
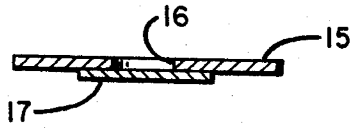
FIG. 4 is a section taken on line 4–4 of FIG. 3.

The disadvantages of opaquing the positive transparency are eliminated, in accordance with the invention, with a pad 15, see FIGS. 3 and 4, having a center opening 16 covered by an optical filter 17 in the form of a colored transparent strip adhesively secured to one surface of the pad. Art sheet 18 is laid out with such pads 15 and tape 19, see FIGS. 5 and 6, in the same manner as described above in the prior art and the completed artwork is used, inter alia, to make two positive transparencies, one with and the other without pad center hole images as explained in detail below.

Figure 7:
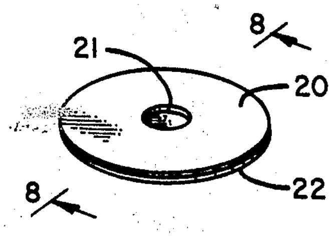
FIG. 7 is a perspective view of a modified form of pad used in the practice of the invention.
Figure 8:
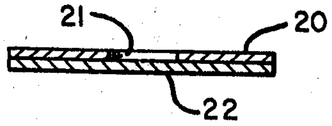
FIG. 8 is a section taken on line 8–8 of FIG. 7.

Another form of the pad construction is shown in FIGS. 7 and 8 as pad 20 having a center opening 21 covered by a color filter 22 having the same dimensions as the pad. The advantage of this pad construction is that it readily may be mass-produced as described in our copending U.S. Pat. application, Ser. No. 779,846 filed Nov. 29, 1968.

Figure 9:
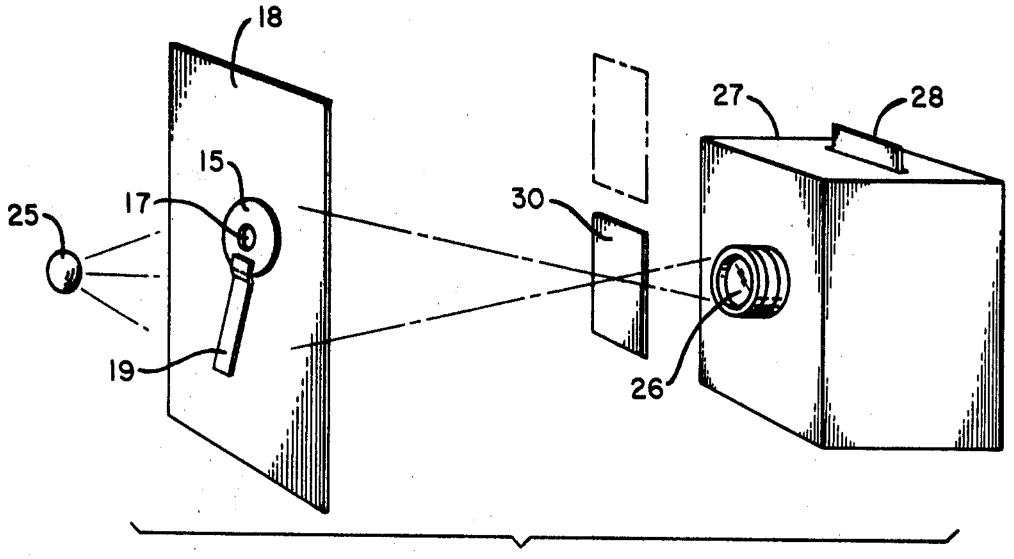
FIG. 9 is a partially schematic perspective view of a photographic system for making printed circuit transparencies in accordance with the invention; and, FIGS. 10 and 11 are perspective views of master transparencies with and without images of pad center openings, respectively, made with the apparatus of FIG. 9.
Figure 10:
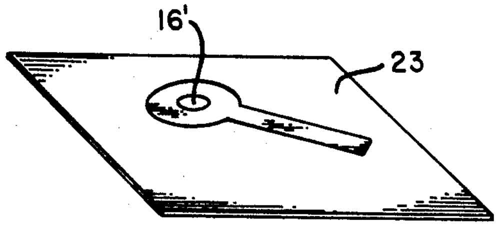
Figure 11:
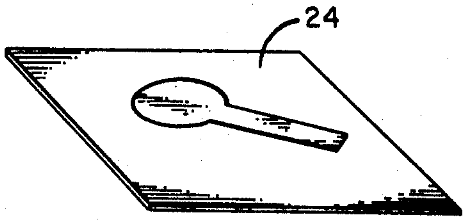

The method by which printed circuit boards with plated-through holes are made in accordance with the invention is illustrated schematically in FIG. 9 and results in two preferably reduced master transparencies 23 and 24 shown in FIGS. 10 and 11. Referring now to FIG. 9, an art sheet 18 laid out with pads 15 is illuminated by lamp 25 and an image of the artwork is projected through lens 26 of camera 27 for exposing film 28. In order to prevent exposure of film 28 by light passing through pad hole 16 and filter 17, a filter plate 30 is placed in front of the camera lens as shown. Plate 30 is optically opaque only to light from pad filter 17 and passes all other light from art sheet 18. As a consequence of this filtering action, master transparency 24, see FIG. 11, has the image of an imperforate pad. In order to make master transparency 23, see FIG. 10, with the image 16' of the pad center opening, filter plate 30 is displaced from alignment with the camera lens to the position indicated in broken lines and another frame of film 28 is exposed. Light passing through pad filter 17 is effective to expose this film and produce the image of the pad center opening on the transparency. In other respects transparencies 23 and 24 are the same and may be negatives, positives or both.

In one embodiment of the invention, white light from lamp 25 was used with cyan blue pad filter 17 to expose orthochromatic film 28 without filter plate 30 and thus produce transparency 23 having images of the pad center openings. Transparency 24 was made by exposing panchromatic film through the same pads and in combination with a red filter plate 30 in front of the camera lens.

Transparency 23 is next used to expose the photosensitized copper-clad board which, after developing, has the centers of the pads visibly formed thereon to facilitate drilling of the holes. After the board is drilled, it is cleaned and electroplated with a thin layer of copper which metallizes the sides of the holes. The board is then photosensitized and transparency 24 is superimposed over the drilled board in precise alignment with the holes therein so that each imperforate pad image thereon covers or masks a hole. The board is then exposed. The circuit pattern thus transferred to the drilled board is developed, the pattern is plated with an etch-resistant metal such as tin-lead, the resist is stripped and the circuit is complete.

It will be understood that the method of making printed circuit boards with plated-through holes in accordance with this invention may be practiced with either positive or negative transparencies, and with negative-acting or positive-acting photoresists which resist either plating or etching. Also various combinations of optical filters 17 and 30 other than colored filters, such as optical polarizers, may be used to selectively block or transmit light which passes through the center openings of the pads.

We claim:

1. The method of making a printed circuit board with plated-through holes consisting of the steps of;
   - forming a circuit pattern on an art sheet with conductor termination pads having center openings;
   - photographically making a first transfer master having the image of said art sheet circuit pattern including said pad openings;
   - photographically making a second transfer master having the image of said art sheet circuit pattern without images of the pad openings;
   - imaging a side of a board through said first master and forming holes in the board coincident with the pad opening images and thereafter plating the sides of said holes; and
   - imaging the perforate board through said second master and permanently forming the desired circuit pattern thereon.
2. The method according to claim 1 in which the making of the second transfer master includes optically filtering out images of the pad openings.
3. The method according to claim 2 in which light is color filtered as it passes through the pad center openings.
4. The method according to claim 2 in which certain wavelengths of the light are blocked upon passage through the pad center openings.
5. The method of making a printed circuit board with plated-through holes consisting of the steps of;
   - forming a circuit pattern on an art sheet with conductor termination pads having center openings covered with optical filters;
   - exposing photographic film to light passing through said art sheet including said pad center openings and making a first transparency of the circuit pattern with images of the pad center openings;
   - similarly exposing photographic film to light passing through said art sheet but optically blocking light passing through the filters in the pad center openings and making a second transparency of the circuit pattern without images of the pad center openings;
   - transferring the pattern image of the first transparency to a circuit board and forming holes through said board on centers located by images of the pad center openings;
   - covering the sides of said holes in said perforate board with an electrically conductive coating;
   - transferring the pattern image on the second transparency to the circuit board in registration with the holes formed therein; and
   - forming said circuit pattern permanently on said board.
6. The method according to claim 5 in which the art sheet circuit pattern is made with pads having center openings covered with translucent colored strips; and disposing a colored filter between the art sheet and film for blocking light from said pad openings in making said second transparency.